United States Patent [19]
Miles

[11] Patent Number: 6,078,504
[45] Date of Patent: Jun. 20, 2000

[54] UNIVERSAL ADAPTER BRACKET FOR COMMUNICATIONS DEVICES

[75] Inventor: Anthony Wayne Miles, Raleigh, N.C.

[73] Assignee: Cisco Systems, Inc., San Jose, Calif.

[21] Appl. No.: 08/947,423

[22] Filed: Oct. 8, 1997

[51] Int. Cl.[7] .............................. H05K 9/00; H05K 7/14
[52] U.S. Cl. ..................... 361/727; 361/684; 361/686; 361/725; 361/752; 361/753; 361/756; 361/796; 361/798; 361/799; 361/800; 361/802; 174/17 CT; 174/35 GC; 174/35 R
[58] Field of Search ................. 174/35 R, 35 GC, 174/17 CT, 50.51, 50.54, 55, 66, 67; 248/27.1, 27.3; 361/732, 747, 740, 759, 679, 683, 685, 686, 684, 687, 688, 796, 752, 753, 754, 798, 799, 800, 801, 802, 756, 725, 727; 439/59, 61, 62, 64, 377, 607, 609, 630, 631, 636

[56] References Cited

U.S. PATENT DOCUMENTS

| | | | |
|---|---|---|---|
| 4,971,563 | 11/1990 | Wells, III | 439/61 |
| 5,121,295 | 6/1992 | Lam | 361/395 |
| 5,311,408 | 5/1994 | Ferchau et al. | 361/818 |
| 5,467,254 | 11/1995 | Brusati et al. | 361/799 |
| 5,478,259 | 12/1995 | Noschese | 439/607 |
| 5,532,428 | 7/1996 | Radloff et al. | 174/35 |
| 5,575,546 | 11/1996 | Radloff | 312/183 |
| 5,579,210 | 11/1996 | Ruhland et al. | 361/801 |
| 5,601,349 | 2/1997 | Holt | 361/801 |
| 5,611,057 | 3/1997 | Pecone et al. | 395/282 |
| 5,640,309 | 6/1997 | Carney et al. | 361/801 |
| 5,654,873 | 8/1997 | Smithson et al. | 361/727 |
| 5,694,291 | 12/1997 | Feightner | 361/683 |
| 5,708,563 | 1/1998 | Cranston, III et al. | 439/61 |
| 5,757,618 | 5/1998 | Lee | 361/686 |
| 5,774,343 | 6/1998 | Benson et al. | 361/801 |
| 5,847,923 | 12/1998 | Lee | 361/684 |

Primary Examiner—Leo P. Picard
Assistant Examiner—John B. Vigushin
Attorney, Agent, or Firm—Cesari and McKenna

[57] ABSTRACT

A universal adapter bracket for installing standard form factor adapter cards such as PCI cards into larger expansion slots of a communications device, such as a router or switch. The adapter bracket has a front face with angled flanges forming an aperture for accepting standard PC brackets, an upper flange with conductive spring clips or foam gasket material, a lower flange for securing a carrier card to the adapter bracket, and fasteners on the front face of the adapter bracket for securing and grounding the adapter bracket to the communications device.

9 Claims, 9 Drawing Sheets

UNIVERSAL ADAPTER BRACKET FOR COMMUNICATIONS DEVICES

BACKGROUND OF THE INVENTION

This invention relates generally to adapter cards for networking communications products, and more particularly to an adapter bracket for installing adapter cards having a standard form factor in a communications device having expansion slots for larger form factor adapter cards.

Communications products such as routers, which are designed to have front accessible adapters which removably slide in and out, sometimes need to be able to accept generic high volume cards of other form factors so that the functions which are available on these cards can be reused easily. For example, asynchronous transfer mode (ATM) function on a card with the peripheral component interconnect (PCI) form factor is needed on routers like the IBM 2210 Multiprotocol Router. Other functional components which are produced in high volumes at reduced costs, such as memory modules, may require a mechanism to allow for insertion of the component into a hub style front access product like the IBM 2210 Multiprotocol Router. The physical fit is important as is electromagnetic compatibility (EMC), performance, appearance, and ease of installation. Cost and adaptability are also key considerations.

Electronics manufacturers can benefit from reusing existing electronic adapters in multiple products because production volumes for the adapters are increased and the resulting development and manufacturing costs are reduced.

The universal adapter bracket/carrier assembly of the present invention enables electronic adapters that have been produced on the PCI card form factor to be used in a family of products that are designed for receiving front-loaded adapters having a larger form factor.

SUMMARY OF THE INVENTION

It is an object of this invention to provide a universal adapter bracket for installing an adapter card having a standard form factor into a larger expansion slot of a communications device.

The present universal adapter bracket design allows one to easily install a PCI or PC style non-front access adapter card into a front access type hub box like the IBM 2210 Multiprotocol Router with minimal effort. The adapter bracket consists of an L-shaped piece of continuous sheet metal which is conductive and can provide EMC shielding when installed in the communications product via numerous contact points around the bracket. Spring clips are installed in an upper flange to provide this contact mechanism while allowing easy entry into, and removal from the product enclosure. The PCI opening in the front of the adapter bracket has two angled flanges which provide close fit and support as well as grounding areas for the PCI adapter card which fits between the flanges. The opening eliminates the need for special faceplates for each PCI card as other communications products have implemented. The front face of the universal adapter bracket has means for fastening the adapter to the hub enclosure after mechanical/electrical connection is made. The fastening means can be thumbscrews, lever latches or other locking mechanisms that both secure the adapter assembly for shipping and ensure ground contact is maintained. The bracket can be fabricated inexpensively on programmable numeric control machines or progressive die machines and can be scaled to fit virtually all enclosure and adapter sizes.

The foregoing has outlined rather broadly the features and technical advantages of the present invention so that the detailed description of the invention that follows may be better understood. Additional features and advantages of the invention will be described hereinafter which form the subject of the claims of the invention. It should be appreciated by those skilled in the art that the conception and the specific embodiment disclosed may be readily used as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The novel features believed characteristic of the present invention are set forth in the appended claims. The invention itself however, as well as a preferred mode of use, further objects and advantages thereof, will be understood by reference to the following detailed description of an illustrative embodiment when read in conjunction with the accompanying drawings, wherein:

DETAILED DESCRIPTION OF THE PREFERRED EMBODIMENT

Figure 1:
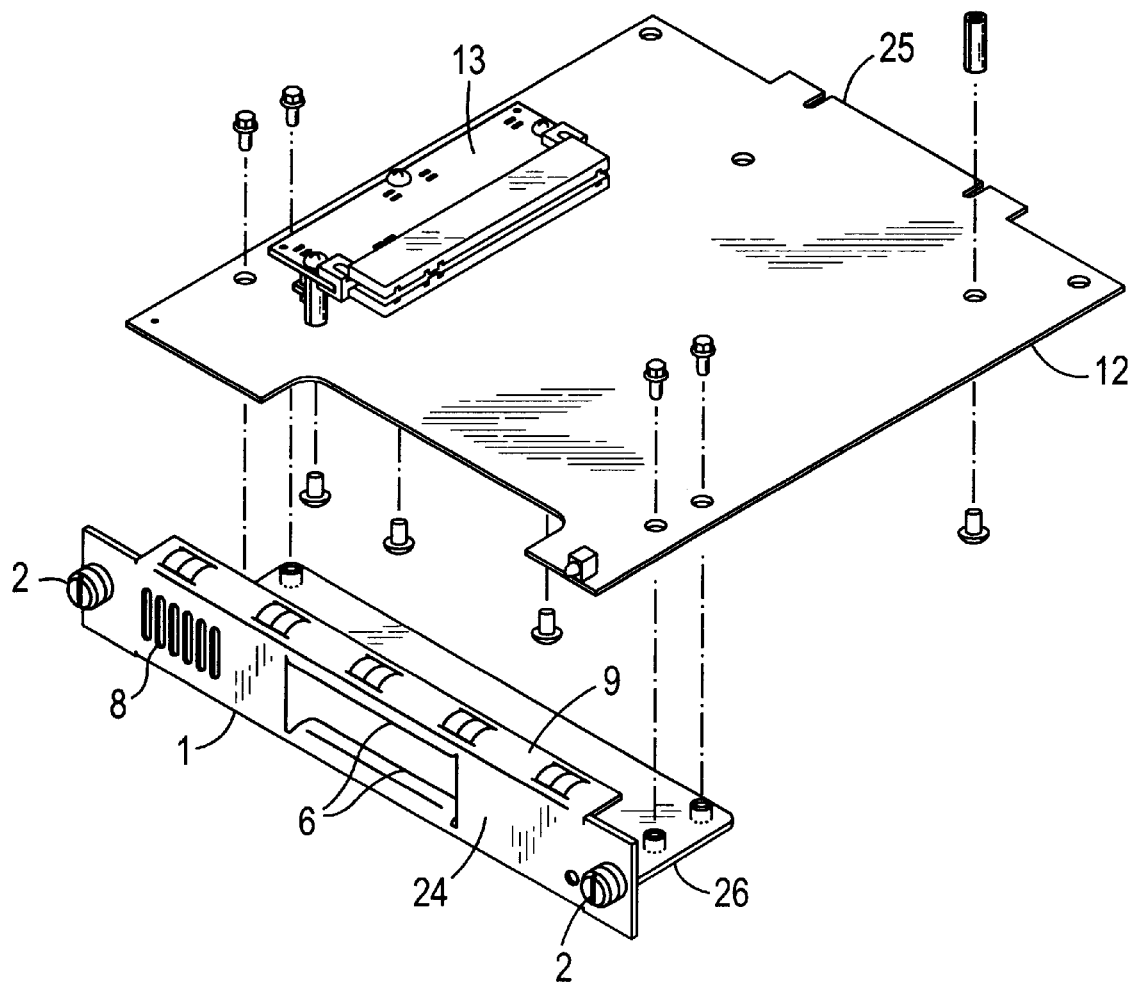
FIG. 1 illustrates an unassembled perspective view of a carrier card and the universal adapter bracket according to the present invention.
Figure 2:
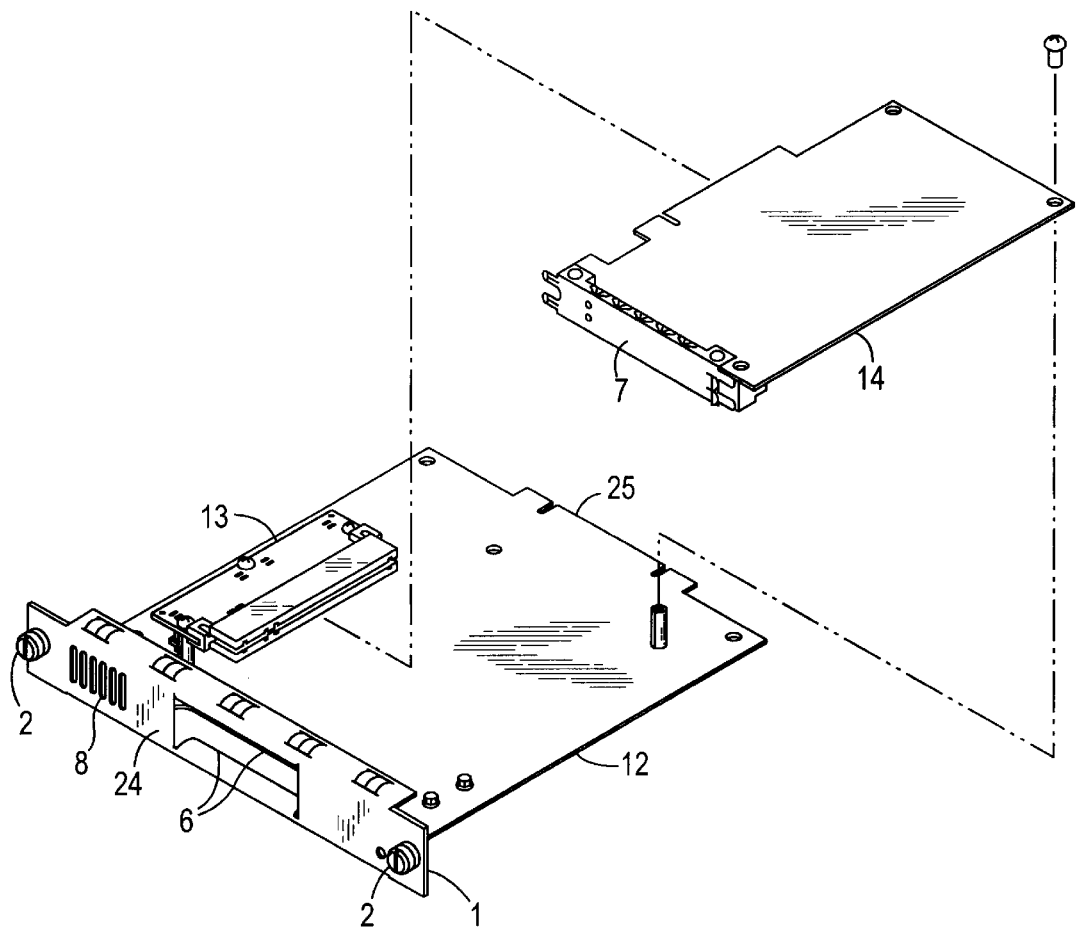
FIG. 2 illustrates a perspective view of an assembled carrier card and universal adapter bracket along with an electronic adapter card that installs into a connector/board assembly on the carrier card.
Figure 9:
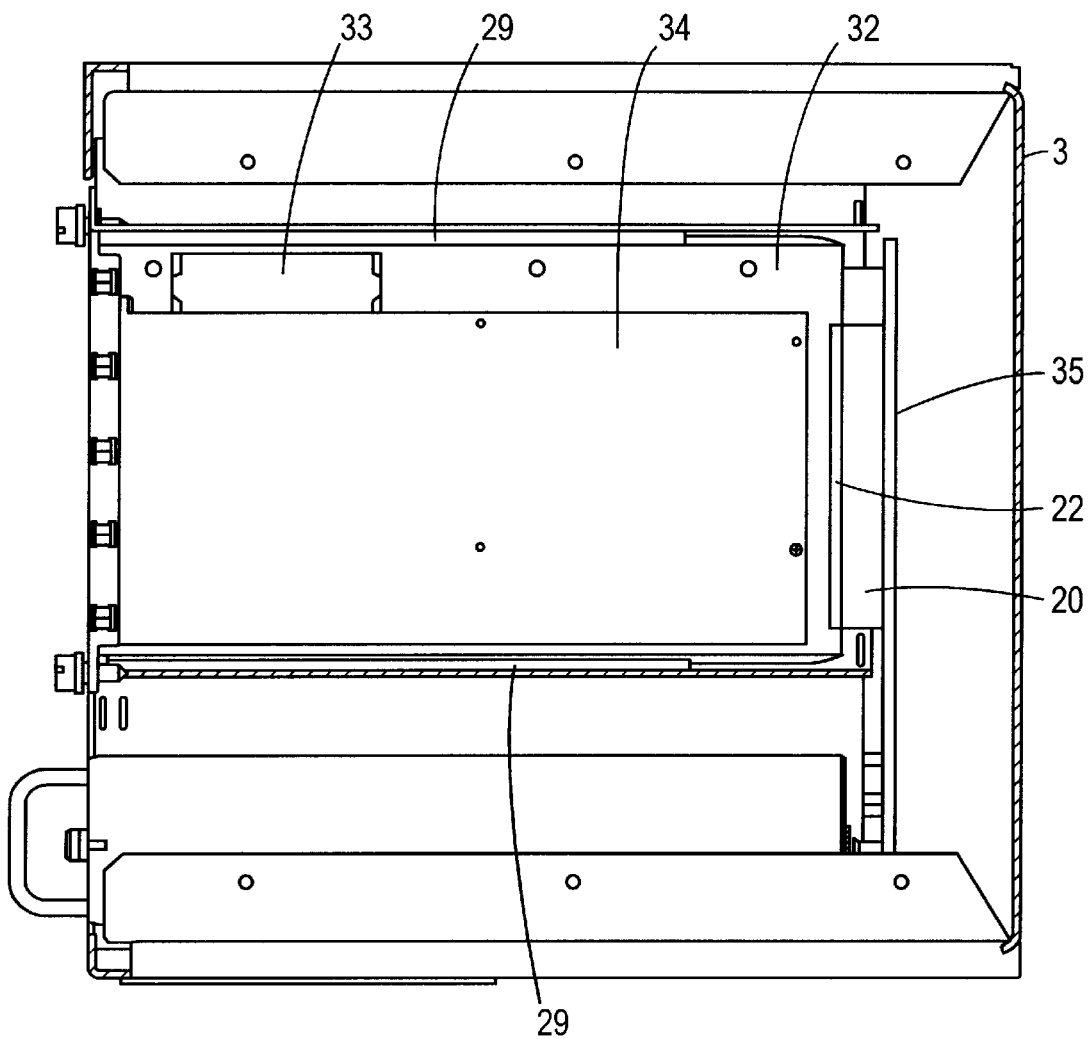
FIG. 9 illustrates a cross sectional view along lines 9—9 of the hub-type product enclosure of FIG. 8.

FIG. 1 shows a carrier card 12 and universal adapter bracket 1 which is designed to facilitate the reuse of electronics that are packaged on the PCI form factor adapter card 14 (FIG. 2). The carrier card has an edge connector 25 that electrically connects to edge connector, block 15 mounted on the receiving product backplane 5 (illustrated in FIG. 3). A mechanism for connecting the carrier card to an edge connector provision on the PCI adapter card 14 can be a connector/board assembly 13 as shown in FIG. 1 or a special right-angled connector 33 as shown in FIG. 9. Adapter bracket 1 includes upper flange 9, lower flange 26, front face 24, air vents 8, fasteners 2 and a pair of angled flanges 6.

Figure 3:
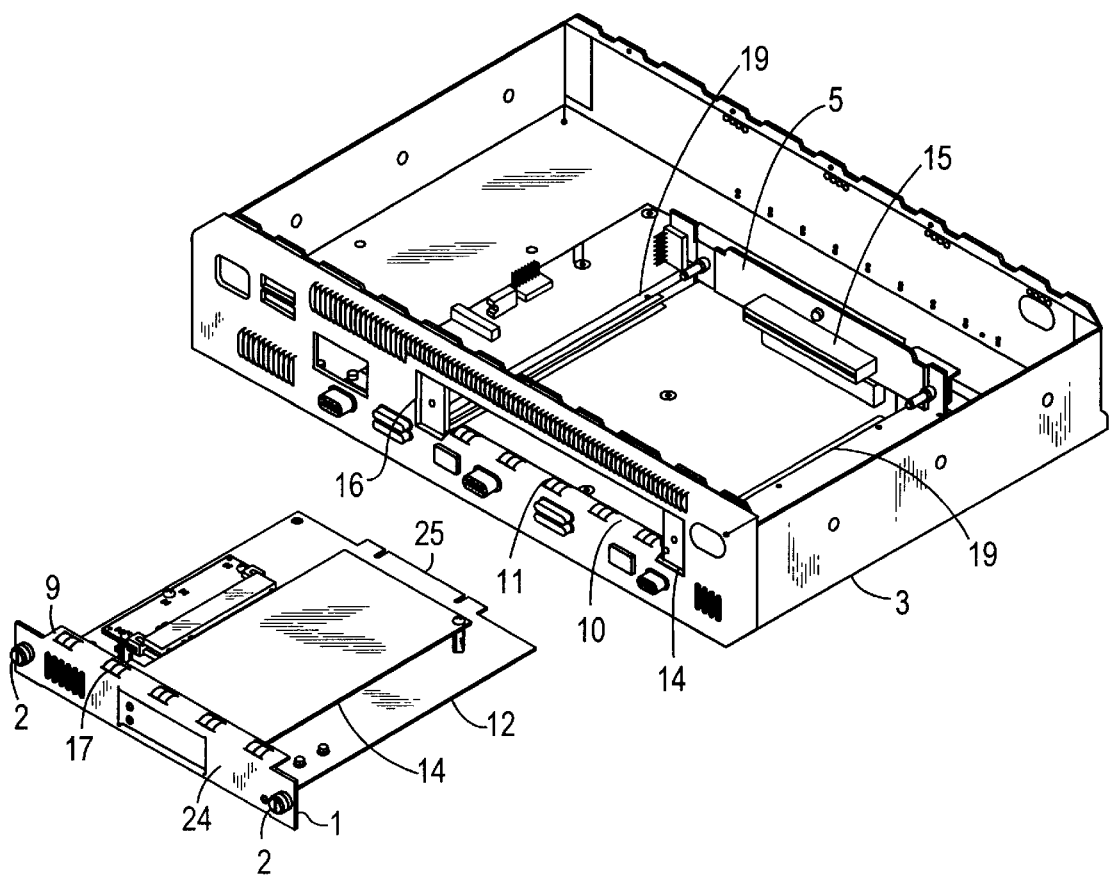
FIG. 3 illustrates a perspective view of the adapter card, carrier card and universal adapter bracket assembly of the present invention and a front access communications device enclosure into which the adapter bracket assembly is inserted.

FIG. 2 shows a carrier card 12 and adapter bracket assembly 1 which are assembled and ready to accept an electronic adapter 14 so that the adapter 14, conforming to the PCI or other standard form factor, can be installed into a front-loaded product such as an IBM 2210 Multiprotocol Router model 24T. The universal bracket assembly 1 is designed to provide structural support and is part of an electronic seal which attenuates radiated emissions from the electronic components inside the product enclosure 3 such as illustrated in FIG. 3.

The adapter carrier card 12 slides within card guide rails 19, which are part of an adapter enabling housing, to make connection with the backplane 5 via an edge connector block 15. When the adapter carrier card 12 is fully seated, contact between the product enclosure 3 and the back of the universal adapter bracket's front face 24 is maintained by the threaded fasteners 2. In cases where injector/ejector levers are used instead of threaded fasteners, or where tolerances are a concern, contact can be improved by applying a flexible conductive gasket material on one of the surfaces which nominally contact each other.

Figure 4:
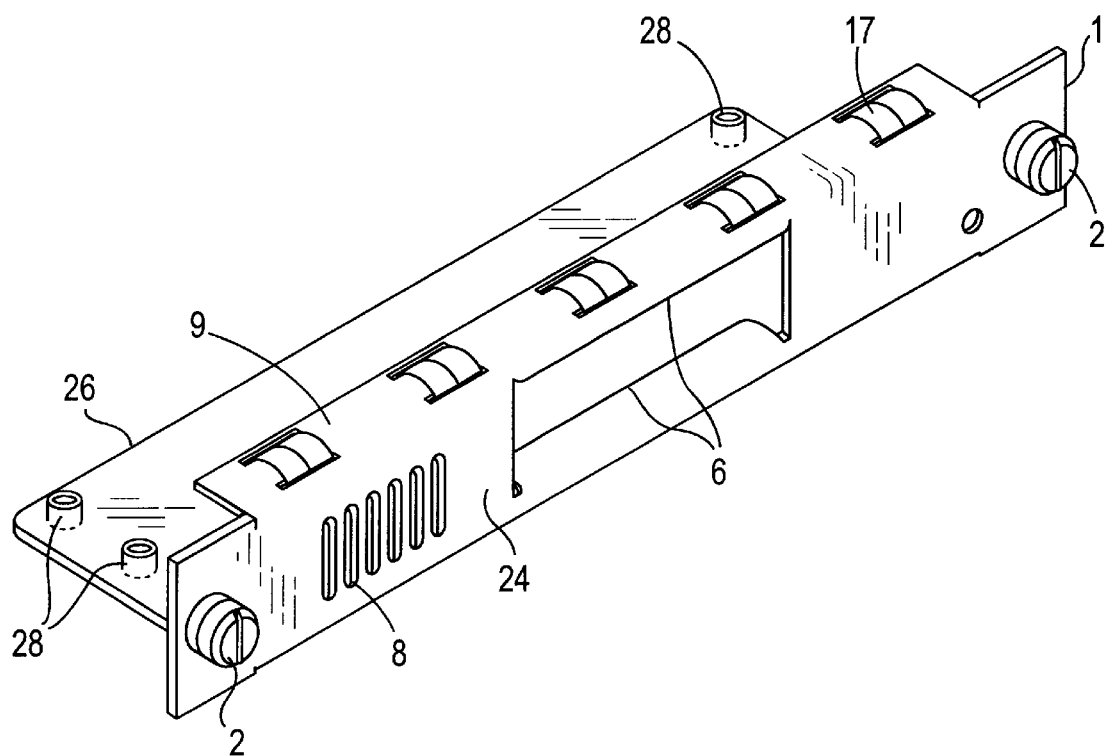
FIG. 4 illustrates a perspective view of one embodiment of the universal adapter bracket assembly having spring clips on its top flange.
Figure 5:
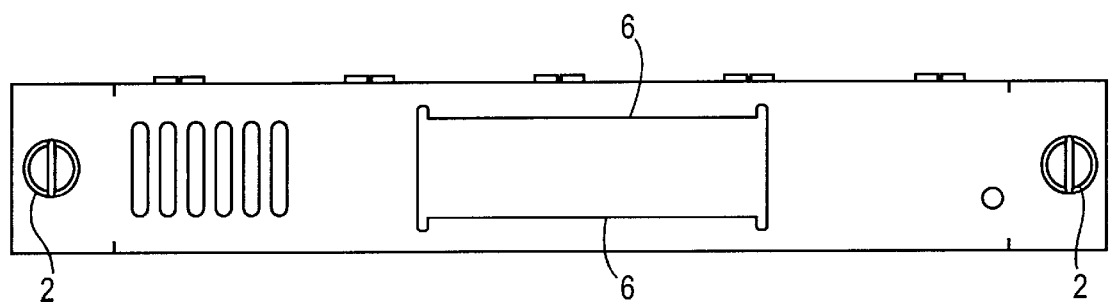
FIG. 5 illustrates a front view of the universal adapter bracket of FIG. 4.
Figure 6:
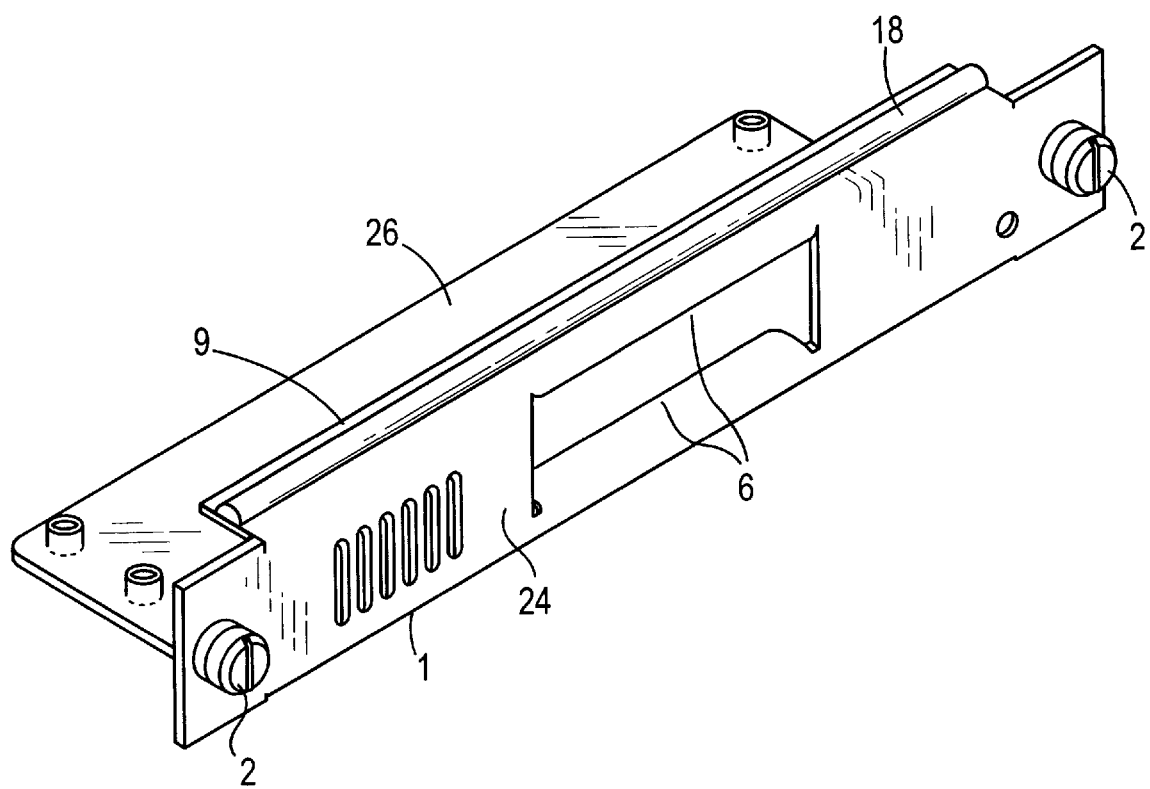
FIG. 6 illustrates a perspective view of an alternate embodiment of the universal adapter bracket having conductive foam gasket on its top flange.

FIGS. 4, 5 and 6 show views of the universal adapter bracket assembly 1 that can be formed from a single sheet of metal. The preferred material for the universal adapter bracket assembly is 1 mm thick commercial quality galvanized low carbon steel which is easy to form and which will maintain surface conductivity in communications product wiring closet environments without any protective overcoating. Additionally, the universal adapter bracket 1 can be painted for appearance or labeling purposes and selectively not painted in areas where a low resistance contact is needed. For example, the area behind the front face 24 that holds the injection/ejection means 2 should not be painted so that it can provide ground contact to the receiving cover flange 16 on the product enclosure for good attenuation of radiated emissions. The injector/ejector mechanism 2 can be a threaded fastener or a commercially available lever that provides additional mechanical advantage for inserting adapters having a large number of contacts. Examples are 2 mm Futurebuss (TM) or CompactPCI (TM) connectors with high pin counts.

FIG. 2 shows the front face 24 of the bracket assembly 1 that has an aperture which is created by folding metal into two angled flanges 6 to accept standard PC adapter brackets 7. The flanges are kept free of paint or any non-conductive covering so that a good electromagnetic seal is formed between the PC adapter bracket 7 and the flanges 6. The flanges 6 are angled, as is more clearly seen in FIG. 5, to match the angled receptacle on typical PC adapter covers 7 which are usually molded plastic with a conductive coating, or cast from metal. The angle is needed for molding or casting purposes. Air vents 8 may be added to allow cooling air to be forced over the adapter bracket assembly 1 as needed. The dimensions of the air vents 8 are selected to optimize air flow and minimize electromagnetic radiation from the product enclosure 3 depending on the electronics that are used. The standard PCI adapter bracket 7 contacts the unpainted angled flanges 6 to seal the aperture in the universal adapter bracket 1. The aperture forms a universal cable access area that enables various adapter cards with different connectors to be accessible for cabling from the exterior of the product.

FIG. 4 shows the upper flange 9 of the adapter bracket 1 which has conductive contacts either attached or formed into the bracket to provide a seal between the mating flange 10 on the product enclosure 3 and the corresponding flange on the adapter bracket 1. Only one of the two mating flanges needs to have the conductive contacts 11. FIG. 4 shows a perspective view of universal adapter bracket 1 having commercially available nickel plated spring clips 17. Alternatively, FIG. 6 shows a perspective view of an alternate embodiment of universal adapter bracket 1 with a continuous conductive foam gasket 18 which has pressure sensitive permanent adhesive backing and adheres to the top flange 9 of the universal adapter bracket 1. The flange 9 can also be formed to create a recess to match the width of the conductive foam gasket 18. This foam gasket material is also commercially available.

Figure 7:
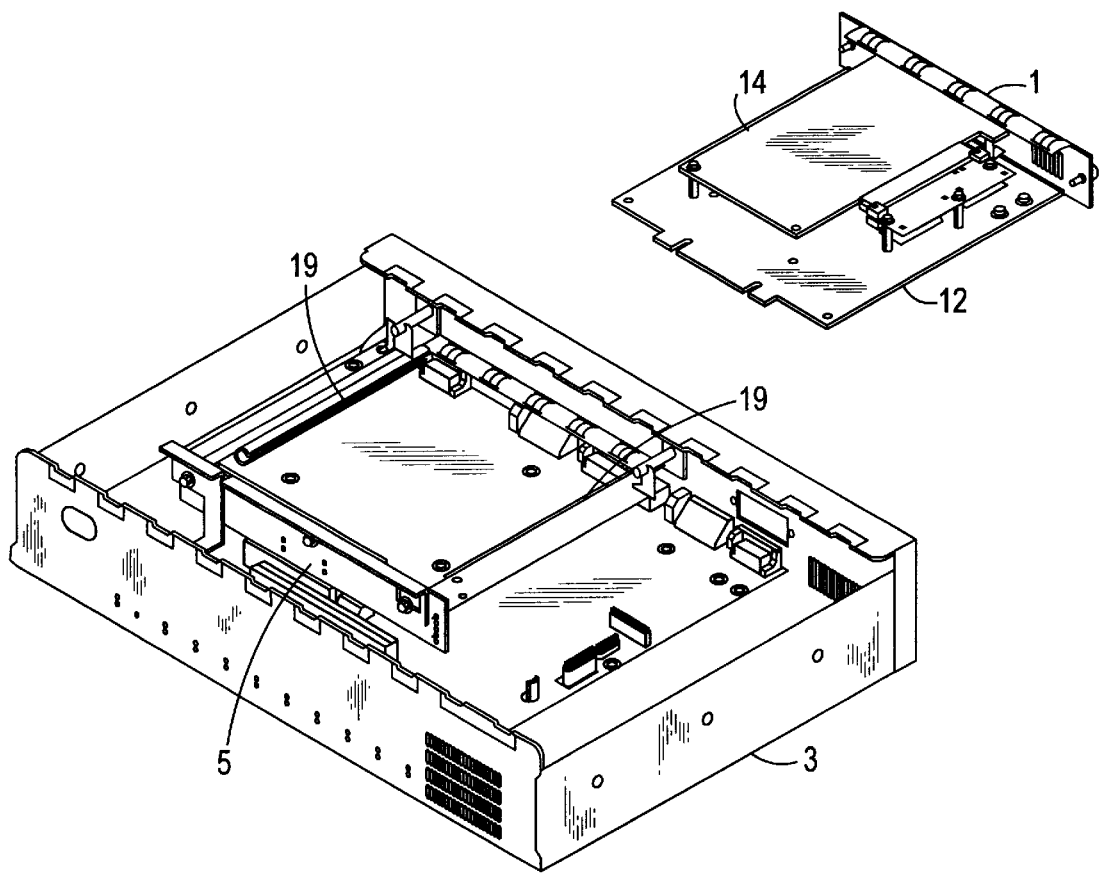
FIG. 7 illustrates a rear perspective view of a communications device enclosure having an adapter enabling housing assembly.

FIG. 7 shows a rear view of a product enclosure 3 with an adapter enabling housing assembly which includes card guide rails 19, and a backplane assembly 5 with a support. The figure also shows the carrier card 12 with a universal adapter bracket assembly 1 and installed adapter assembly 14 oriented for installation into the product enclosure 3. This configuration can be used for small products with a few adapter slots which are horizontally aligned.

Figure 8:
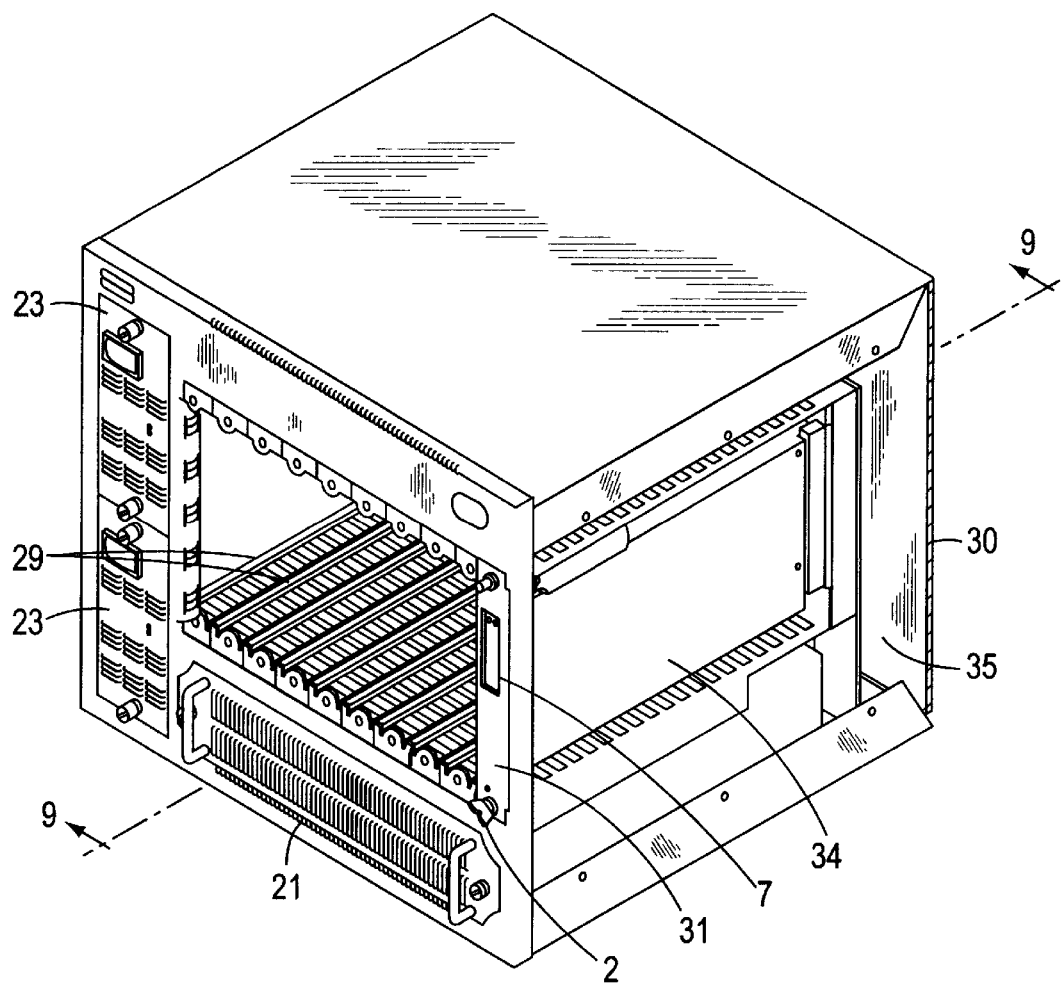
FIG. 8 illustrates a perspective view of a hub-type product enclosure having multiple slots for accepting vertically-aligned adapter carrier cards and universal adapter brackets in accordance with the present invention.

For larger products, FIG. 8 shows a hub-type product enclosure with vertically oriented adapters. This configuration makes cooling easier since air inlets can be located on the lower part of the enclosure with exits on the top of the enclosure to take advantage of the chimney effect when air is heated. However, front to back cooling is possible since the adapter brackets have provisions for vents in the front.

FIG. 8 shows a 10-slot hub-type product enclosure 30 that has two power supplies 23 which also plug into the backplane assembly 35. Each slot is cooled by forced air from the cooling assembly 21 which can hold numerous air moving devices. In practice, eight of the ten slots might be designated for adapters while the remaining two slots would be system adapter slots for the product. Cable connections to the adapter 34 can be made through the aperture in the universal adapter bracket 31 and the PCI bracket 7.

FIG. 9 shows a cross-sectional view of a hub box with vertically oriented adapters along line 9—9 of FIG. 8. The side of the enclosure is cut away so that the internal parts are visible. The adapter carrier card 32 has a universal adapter bracket 31 attached which may be longer to accept a full-size PCI adapter 34. The bracket/carrier assembly with the adapter 34 installed slides down vertically oriented card guide rails 29 so that the connection means 22 on the rear of the carrier card 32 connects with the connector 20 on the backplane 35. The backplane 35 may be a single circuit board with multiple connectors 20 to match the number of adapter slots used.

Additionally, the front loading adapter card can include features that make hot plugging to the communications product possible. The features include a delay mechanism and a connection which has multi-length contact pins so that certain connections are made before others. Specifically, the power pins would be longer than the signal pins so that when the adapter card is plugged into the hub, the power connections are made slightly before the signal connections. This delay time can be controlled by replacing the retractable thumbscrews 2 on the universal adapter bracket 1 with non-retracting thumbscrews or levers that preclude rapid movement of the adapter during the last part of the connection travel. Examples are commercial thumbscrews with a very coarse thread pitch or levers which require a two stage plug-in action. Other hot plug schemes can be used which employ a separate detection switch for each adapter card.

While the invention has been particularly shown and described with reference to the particular embodiments thereof, it will be understood by those skilled in the art that various changes in form and details may be made therein without departing from the spirit and scope of the invention.

Having thus described my invention, what I claim and desire to secure as Letters Patent is as follows:

1. An adapter bracket for installing adapter cards complying with a specified form factor and mounted on a carrier card through an external expansion slot into an internal adapter housing in a communications device, comprising:

a front face including a pair of angled flanges formed on a portion of said front face to provide an aperture for accepting a standard angled bracket fastened to an edge of said adapter card;

a bottom flange for providing a flat surface for mounting said carrier card to said adapter bracket; and a top flange for securing said adapter bracket to said communications device and including a plurality of spring clips in said top flange for providing both a conductive contact and a seal between said adapter bracket and said communications device.

2. The adapter bracket of claim 1 further comprising a conductive foam gasket with a pressure sensitive adhesive backing attached to the top flange for providing both a conductive contact and a seal between said adapter bracket and said communications device.

3. The adapter bracket of claim 1 wherein said adapter bracket is fabricated from galvanized low carbon steel.

4. An adapter bracket for installing adapter cards complying with a specified form factor and mounted on a carrier card through an external expansion slot into an internal adapter housing in a communications device, comprising:

a front face including a pair of angled flanges formed on a portion of said front face to provide an aperture for accepting a standard angled bracket fastened to an edge of said adapter card;

a bottom flange for providing a flat surface for mounting said carrier card to said adapter bracket; and a top flange for securing said adapter bracket to said communications device and including a conductive foam gasket with a pressure sensitive adhesive backing attached to the top flange for providing both a conductive contact and a seal between said adapter bracket and said communications device.

5. The adapter bracket of claim 4 wherein said adapter bracket is fabricated from galvanized low carbon steel.

6. An adapter bracket for installing adapter cards complying with a specified form factor and mounted on a carrier card through an external expansion slot into an internal adapter housing in a communications device, wherein said internal adapter housing includes a backplane, a pair of side flanges attached to said backplane and to the rear of said exterior surface of said communications device so as to form a rectangular housing structure, said side flanges each having a guide rail disposed along an interior surface for receiving said carrier card, and said backplane having an edge connector block mounted thereon for electrically connecting said carrier card to said backplane, the adapter bracket comprising:

a front face including a pair of angled flanges formed on a portion of said front face to provide an aperture for accepting a standard angled bracket fastened to an edge of said adapter card; and an injector/ejector mechanism for fastening said adapter bracket to an exterior surface of said communications device containing card external expansion slot;

a bottom flange for providing a flat surface for mounting said carrier card to said adapter bracket; and a top flange for securing said adapter bracket to said communications device.

7. The adapter bracket of claim 6 further comprising a plurality of spring clips in said top flange for providing both a conductive contact and a seal between said adapter bracket and said communications device.

8. The adapter bracket of claim 6 further comprising a conductive foam gasket with a pressure sensitive adhesive backing attached to the top flange for providing both a conductive contact and a seal between said adapter bracket and said communications device.

9. The adapter bracket of claim 6 wherein said adapter bracket is fabricated from galvanized low carbon steel.

\* \* \* \* \*